(12) United States Patent
Bacigalupo

(10) Patent No.: US 10,425,067 B2
(45) Date of Patent: Sep. 24, 2019

(54) MEMORY DEVICE AND METHOD FOR OPERATING A MEMORY DEVICE

(71) Applicant: Infineon Technologies AG, Neubiberg (DE)

(72) Inventor: Tommaso Bacigalupo, Fuerstenfeldbruck (DE)

(73) Assignee: Infineon Technologies AG, Neubiberg (DE)

( * ) Notice: Subject to any disclaimer, the term of this patent is extended or adjusted under 35 U.S.C. 154(b) by 118 days.

(21) Appl. No.: 15/392,089

(22) Filed: Dec. 28, 2016

(65) Prior Publication Data

US 2017/0187359 A1 Jun. 29, 2017

(30) Foreign Application Priority Data

Dec. 29, 2015 (DE) .......... 10 2015 122 907

(51) Int. Cl.
*H03K 3/037* (2006.01)
*H03K 3/356* (2006.01)

(52) U.S. Cl.
CPC ..... *H03K 3/0375* (2013.01); *H03K 3/356104* (2013.01)

(58) Field of Classification Search
CPC ........ H03K 3/0375; H03K 3/356104

USPC ....................................................... 327/211
See application file for complete search history.

(56) References Cited

U.S. PATENT DOCUMENTS

| 6,894,330 | B2 | 5/2005 | Bachhofer et al. |
| 7,337,356 | B2* | 2/2008 | Mudge .................. G06F 9/3861 |
| | | | 714/10 |
| 7,650,551 | B2 | 1/2010 | Flautner |
| 8,330,517 | B1 | 12/2012 | Cline |
| 8,872,691 | B1* | 10/2014 | Stepanovic ............. H03M 1/06 |
| | | | 341/144 |
| 9,112,489 | B2 | 8/2015 | Priel et al. |
| 2009/0141538 | A1 | 6/2009 | Fifield et al. |
| 2009/0210184 | A1 | 8/2009 | Medardoni et al. |
| 2011/0074466 | A1 | 3/2011 | Pedersen et al. |

FOREIGN PATENT DOCUMENTS

CN 104700900 A 6/2015

* cited by examiner

*Primary Examiner* — Dinh T Le
(74) *Attorney, Agent, or Firm* — Eschweiler & Potashnik, LLC

(57) ABSTRACT

Devices are provided in which a metastable state can be detected in a memory device by means of a metastability detector. Corresponding information can be conveyed to a further device which, in dependence thereon, can process data from the memory device.

18 Claims, 7 Drawing Sheets

MEMORY DEVICE AND METHOD FOR OPERATING A MEMORY DEVICE

CROSS REFERENCE TO RELATED APPLICATIONS

This application claims priority to German Application No. 102015122907.2, filed on Dec. 29, 2015, and incorporated herein by reference in its entirety.

FIELD

The present application relates to a memory device and to a method for operating such a memory device.

BACKGROUND

Memory devices are generally used for storing digital values, for example results of calculations. Examples of such memory elements are so-called latches, such a latch being able to store a 1-bit value, that is to say one of two possible states. A further example are flip-flops which, for example, can be built up from latches. A value to be stored can be written to such memory elements.

For correctly writing values into such memory devices, timing requirements must be usually observed. In particular, so-called setup and hold times must be maintained. This essentially means that a value to be written must be present a certain time before (setup time) and a certain time after (hold time) a writing time, wherein the writing time can be determined, for example, by a clock signal, an activation signal or the like. In the case of a timing violation, it may happen that the memory device assumes a metastable state. If, for example, a logical 0 is defined by ground and a logical 1 by a positive supply voltage VDD, the metastable state can be approximately VDD/2. In a memory device such as a latch this metastable state then changes into a stable state (zero or one) after an undefined (i.e. unknown) time. This undetermined time is also called recovery time.

If subsequent circuit elements which use the stored value read the value out of the memory device during the metastable state, it is essentially randomly interpreted as a 0 or a 1 which leads to an unpredictable behaviour of such subsequent circuit parts (for example a logic). It is desirable, therefore, to avoid or to recognize such metastable states if possible.

From U.S. Pat. No. 5,789,945, a latch is known in which the abovementioned recovery time is shortened with the presence of a metastable state. However, it is not predictable here when the system will assume a stable state and it is still possible that subsequent circuit parts operate on the basis of the metastable state.

Other memory devices are known from U.S. Pat. No. 7,965,119 B2, US 2014/0211893 A1, U.S. Pat. No. 8,552,779 B2, U.S. Pat. No. 7,880,506 B2, U.S. Pat. No. 6,906,555 B2 or U.S. Pat. No. 6,498,513 B1.

It is an object, therefore, to provide memory devices by means of which a subsequent processing of stored values can be improved with regard to metastable states.

DETAILED DESCRIPTION

In the text which follows, various exemplary embodiments will be explained in detail with reference to the attached drawing. It should be noted that these exemplary embodiments are only used for illustration and should not be considered to be restrictive. In particular, a description of an exemplary embodiment having a multiplicity of elements or features should not be considered in such a respect that all these features or elements are necessary for the implementation. Instead, other exemplary embodiment can have fewer features or elements or alternative features or elements. In addition, other features or elements can be present in addition to the features and elements shown and described, for example features or elements of conventional memory devices.

Features or elements of various exemplary embodiments can be combined with one another unless otherwise specified. Variations and deviations which are described for one of the exemplary embodiments can also be applicable to other exemplary embodiments.

Connections and couplings which are shown in the figures or described in the text which follows can be direct connections or couplings, i.e. connections or couplings without intermediate elements, or indirect connections or couplings, i.e. connections or couplings with one or more additional intermediate elements as long as the fundamental functionality of the connection or coupling, for example to transmit a particular type of signal or information or to perform a particular activation, is maintained. Connections or couplings can be wire-connected connections or couplings or wireless connections or couplings.

Figure 1:
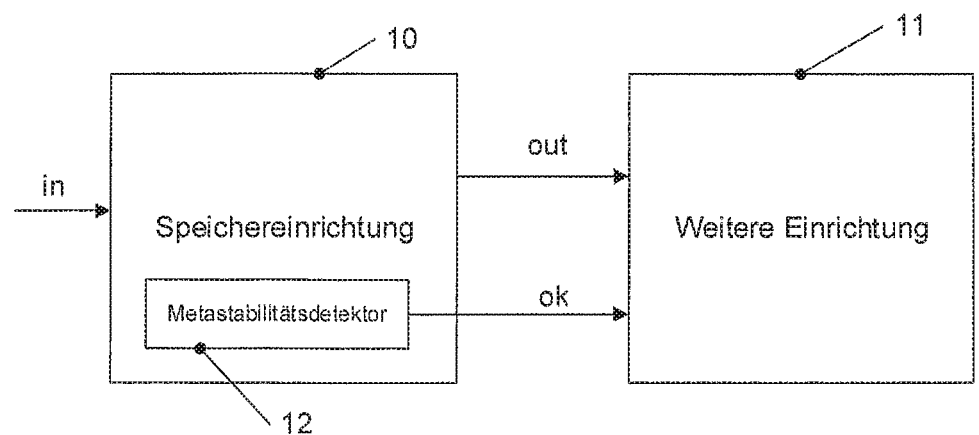
FIG. 1 is a block diagram of a system according to an exemplary embodiment.

In FIG. 1, a block diagram of a system according to one exemplary embodiment is shown. The system of FIG. 1 here shows a memory device 10 according to one exemplary embodiment and a further device 11 connected after the memory device 10. The further device 11 here comprises, in particular, circuits which process further stored values read out of the memory device 10.

In this context, the memory device 10 can comprise, in particular, a static memory device such as a latch or a flip-flop. The memory device 10 receives values to be written in and outputs stored values out to the further device 11. In addition, the memory device 10 outputs an ok signal to the further device 11. The ok signal here indicates whether a stable state or a metastable state is present in the memory device 10. Such a metastable state can occur, for example, in the case of a timing violation (for example setup or hold violation) during writing into the memory device 10.

In the exemplary embodiment of FIG. 1, the further device 11 is thus informed by means of the ok signal about whether a metastable state is present. The further device 11 can then wait, for example in the case of the presence of a metastable state, with the processing of data output by the memory device 10 (via the out signal) until no further metastable state is present and a stable state is indicated by the ok signal. This is advantageous particularly with asynchronous circuits in which the processing in the further device 11 does not take place on the basis of a clock signal. In other exemplary embodiments, the presence of a metastable state can point to an error in the circuit. For example, no timing violations should occur in the case of correctly designed synchronous circuits which are based on a clock. In this case, the presence of a metastable state can point out, for example, that the circuit or a clock signal has changed due to ageing processes or the like in such a manner that now timing violations can also occur. In this case, corresponding safety measures can be taken by the further device 11.

The further device 11 can also use the ok signal for a better (i.e. especially faster) synchronization logic compared with two-stage synchronization circuits used as a standard.

Since the ok signal is thus provided externally by the memory device 10, the further device 11 can respond accordingly—in contrast, for example, to cases in which the ok signal 10 is only used internally in the memory device 10.

In order to be able to form the ok signal, the memory device 10 has a metastability detector 12 which detects a stable and/or a metastable state in the memory device 10. Examples of such a metastability detector and examples of suitable memory devices 10 will now be explained in greater detail with reference to FIGS. 2-9. It must be noted that the term "memory device" and the representation of FIG. 1 do not imply any particular relative arrangement between the metastability detector 12 and remaining parts of the memory device 10. The metastability detector 12 can thus be integrated with the remaining memory device 10 in an integrated circuit, but can also be provided on a separate chip or a separate circuit board.

Figure 2:
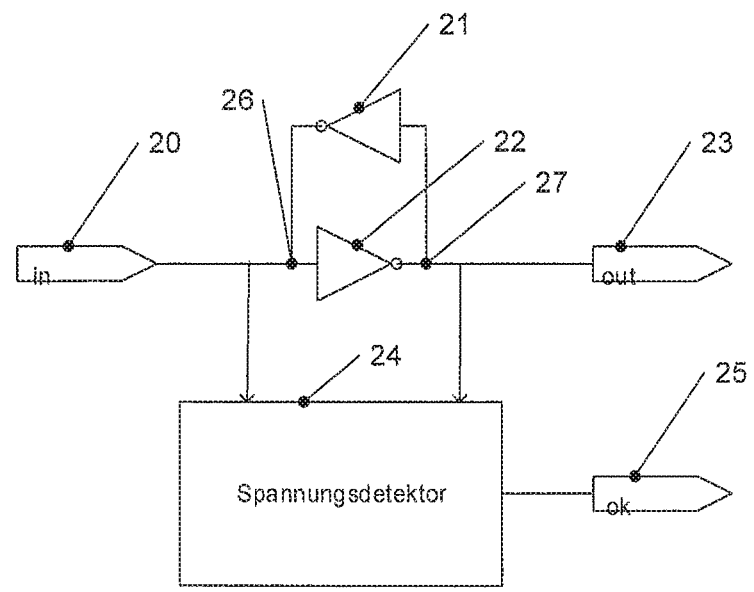
FIG. 2 is a diagrammatic representation of a memory device according to an exemplary embodiment.

FIG. 2 shows a memory device according to an exemplary embodiment. The memory device of FIG. 2 is here configured as a latch having two negative feedback inverters 21, 22. Such negative feedback inverters lead to a stored data value being retained, that is to say stored, in a memory state (i.e. in a state in which no data are written). Data can be written into the memory device via an input 20, that is to say at a node 26, a value can be specified which, on the one hand, leads to the value inverted with respect to the value at node 26 at a node 27. In the example of FIG. 2, the node 27 can then be read out at an output 23. It must be noted that this is only a diagrammatic representation of a latch. A more detailed example will be explained later. However, various types of latches can be used, particularly those which, as shown in FIG. 2, comprise two negative feedback inverters.

To detect a metastable state, a voltage at node 26 and a voltage at node 27 are evaluated by means of a voltage detector 24. In a stable state, the voltage at one of nodes 26, 27 corresponds to a logical 0 and to a logical 1 at the other one of nodes 26, 27 which corresponds to two different possible stable states. If, in contrast, a metastable state is present, the voltages at nodes 26, 27 are approximately equal and are between the voltages allocated to a logical 0 and to a logical 1. Thus, it is possible to determine by evaluating the voltages whether there is a metastable state present. The result of the evaluation can then be output as ok signal at a further output 25 in order to enable a further device (like the device 11 of FIG. 1) to respond to the presence of a metastable state.

Essentially, a comparison between the voltages at node 26 and node 27 can be performed by the voltage detector 24. If the absolute value of the voltage difference is greater than a threshold value, there is a stable state present, if the voltage difference is less than the threshold value, a metastable state is present. Such a metastable state changes into a stable state after some time, the time, the recovery time initially mentioned, not being precisely predictable. By means of the signal output at the further output 25, it can thus be determined from outside the memory device of FIG. 2 whether this recovery time has already elapsed and a stable state is present.

This will now be explained in greater detail with reference to FIGS. 3A to 3C. In this context, it is assumed in the explanation of FIGS. 3A to 3C that a logical 1 is linked, for example, to a positive supply voltage VDD whilst a logical 0, for example, is linked to ground.

Figures 3A, 3B, 3C:
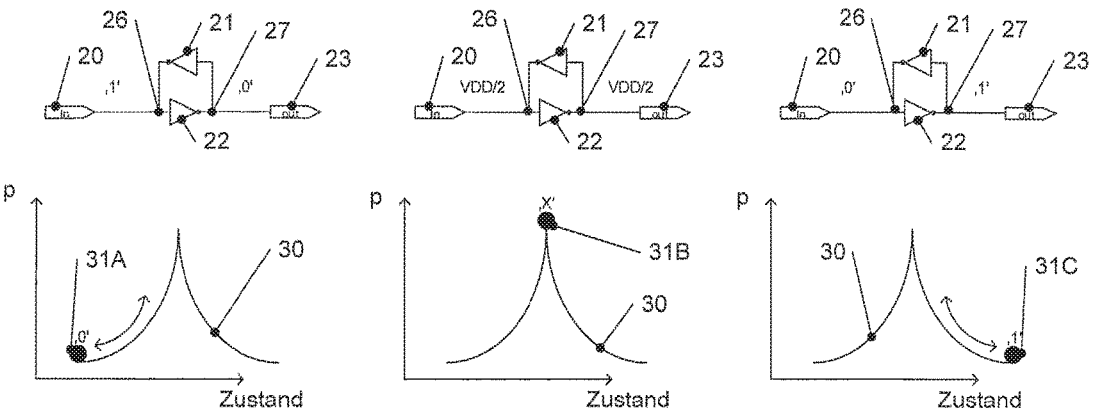
FIGS. 3A to 3C are diagrams for illustrating various states of a memory device.

In an upper part of FIGS. 3A to 3C, the latch of FIG. 2 (without voltage detector 24 and output 25) is shown in each case for three different states and identical elements carry the same reference symbols as in FIG. 2.

In the case of FIG. 3A, the voltage at node 26 corresponds to a logical 1 and the voltage at node 27 to a logical 0. In the case of FIG. 3C, the voltage at node 26 corresponds to a logical 0 and the voltage at node 27 to a logical 1. These are two stable states of the latch. In the case of FIG. 3B, in contrast, there is a metastable state in which both node 26 and node 27 are approximately at VDD/2. The precise position of the metastable point depends on the precise implementation of the latch. In particular, the voltages can shift from latch to latch due to production tolerances of the inverters 21, 22.

In the lower part of FIGS. 3A to 3B, a curve 30 is in each case shown which represents a measure p of the probability about a respective state that this state will be abandoned. A point 31A designates the stable state of FIG. 3A at which output 23 of the latch is at a logical 0. A point 31C of FIG. 3C shows the state of FIG. 3C at which output 23 is at a logical 1. In FIG. 3B, a point 31B shows the metastable state.

The transition of curve 30 occurs here towards lower values p. In the case of the metastable state of FIG. 3B, the transition within the recovery time can therefore take place either towards the state of FIG. 3A or towards the state of FIG. 3C.

As can be seen from FIGS. 3A to 3C, the presence of a metastable state can be detected by evaluating the voltage at nodes 26, 27 as already explained with reference to FIG. 2.

Figure 4:
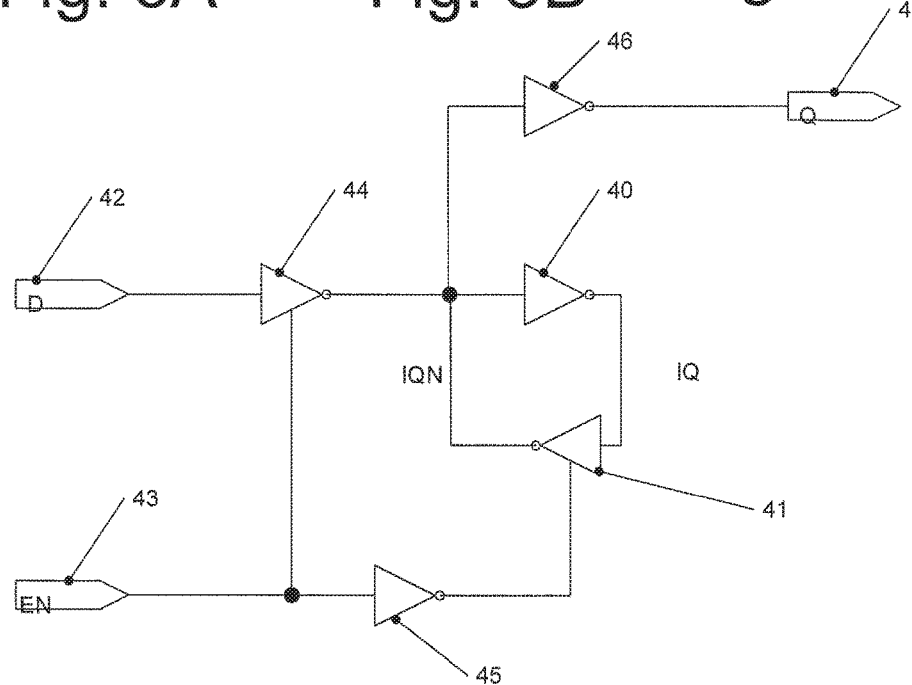
FIG. 4 is a circuit diagram of a latch which can be used for exemplary embodiments.

FIG. 4 shows a circuit diagram of a latch which is used as the basis for further exemplary embodiments. Similar to the latch discussed with reference to FIG. 2, the latch of FIG. 4 comprises two negative feedback inverters 40, 41. In the simple exemplary embodiment of FIG. 2, however, it would be necessary for writing a new value to "overdrive" the inverters, i.e. to apply a voltage of such amplitude or a current of such amplitude that the inverters can no longer hold the value which they are storing. Such "overdriving", however, can lead to a high current flow and be undesirable. To avoid this, the latch of FIG. 4 has an activation input (enable) 43 in addition to a data input 42.

The data input 42 is connected via an inverter 44 to a node IQN of the negative feedback inverters 40, 41. IQ designates the other nodes of the negative feedback inverters 40, 41.

Instead of the inverter 44, other suitable components such as a buffer or also an inverter chain can also be used.

In this context, the inverters 41, 44 are inverters which can be placed into a "tristate" state which is essentially an inactive state. If the activation signal at the activation input 43 is at a logical 1, the inverter 44 is active, i.e. it operates as a normal inverter. The activation signal is also supplied via an inverter 45 to a control input of the inverter 41. If the activation signal is 1, the inverter 41 is placed into the tristate state via the inverter 45, that is to say essentially deactivated so that the inverters 40, 41 do not operate as negative feedback inverters. In this case, the latch is transparent and the output 47, which is coupled to the node IQN via an inverter 46, follows the input 42.

This state can be used, in particular, for bringing the node IQN to a desired value to be stored without the negative feedback inverters 40, 41, e.g. the pair of inverters 40, 41 coupled in a negative feedback configuration, having to be overdriven.

To store a value in the latch, the activation signal is then set to 0. The inverter 44 is thus deactivated and thus decouples the input 42 from the node IQN. In addition, inverter 41 is activated via the inverter 45 so that the negative feedback inverters 40, 41 now hold a stored value.

Figure 5:
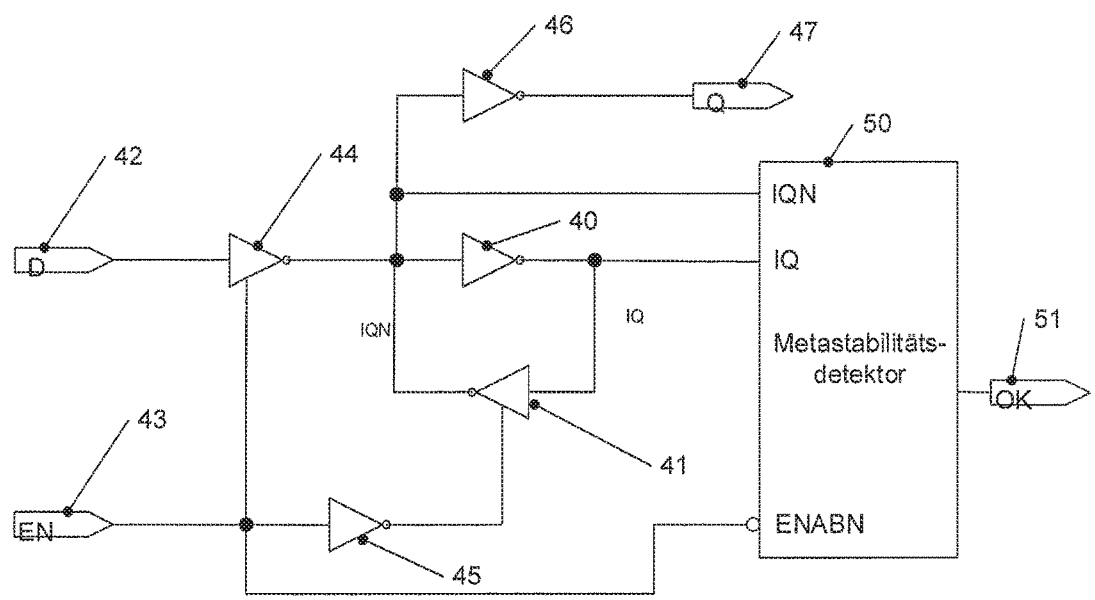
FIG. 5 shows an exemplary embodiment of a memory device based on the latch of FIG. 4.

A metastable state can occur if the activation signal 43 is switched from 1 (transparent state) to 0 (memory state). In exemplary embodiments, a metastability detector such as, for example, the voltage detector 24, is only activated, therefore, when the activation signal is 0 since a metastable state may occur in this case. A corresponding exemplary embodiment is shown in FIG. 5. The exemplary embodiment of FIG. 5 is based on the exemplary embodiment of FIG. 4 and identical elements carry the same reference symbols and will not be explained in greater detail again.

In FIG. 5, the signal at node IQN, the signal at node IQ and the activation signal are supplied to a metastability detector 50. The metastability detector 50 is activated by the activation signal when the activation signal is 0. If the activation signal is 1, the metastability detector 50 outputs a predetermined value as ok signal at an output 51, for example a predetermined value which indicates that there is no stable state. If the activation signal is 0, that is to say there is a memory state present, the metastability detector 50 determines on the basis of the signals at nodes IQN and IQ whether there is a metastable state or a stable state present and outputs a corresponding signal as ok signal at output 51. This detection can take place by a voltage comparison as explained with reference to FIG. 2. More detailed exemplary embodiments of metastability detectors will be explained in greater detail in the text which follows, with reference to FIGS. 5-8.

Figure 6:
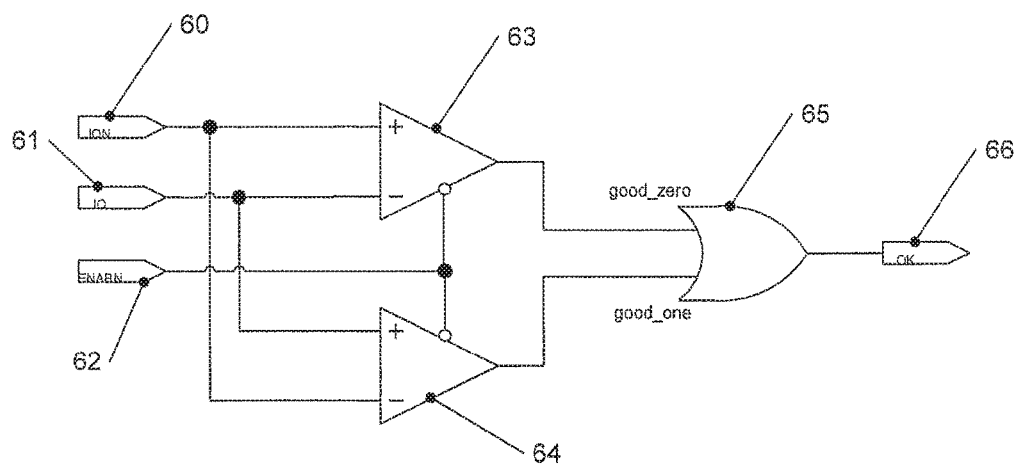
FIG. 6 shows an exemplary embodiment of a metastability detector.

FIG. 6 shows an exemplary embodiment of a metastability detector which, for example, can be used as metastability detector 50 of FIG. 5. However, the metastability detector of FIG. 6 can be used not only in the memory device of FIG. 5 but is generally applicable to latches which have negative feedback inverters and an activation input. In addition, the metastability detector of FIG. 6 is also applicable to memory devices which are built up on such types of latches, for example flip-flops which are built up on such types of latches.

The metastability detector of FIG. 6 has a first input 60 for receiving a signal from a first node of a pair of negative feedback inverters (for example from node IQN of FIG. 5), a second input 61 for receiving a signal from a second node of the pair of negative feedback inverters (for example node IQ of FIG. 5) and a third input 62 for receiving an activation signal (for example the activation signal supplied at input 43 of FIG. 5). Furthermore, the metastability detector of FIG. 6 has a first comparator 63 and a second comparator 64. When the activation signal is 1 (which corresponds to a transparent state of the latch of FIG. 4 or 5), the comparators 63 and 64 are deactivated and output, for example, a zero at their output. The outputs of comparators 63, 64 are linked to an OR gate 65 so that in this case, a value of zero is then output at an output 66 which indicates that there is no stable state present (not ok).

Otherwise, when the activation signal is 0, the comparators 63, 64 compare a difference of the signals at inputs 60, 61 with a predetermined threshold value. In this context, input 60 is connected to a positive input of comparator 63 and to a negative input of comparator 64 and input 61 is connected to a negative input of comparator 63 and to a positive input of comparator 64. If, for example, a value of zero is stored in the latch, input 60, in the case of the latch of FIG. 5, is at a logical 1 and the input at a logical 0. Comparator 63 then determines that the difference (for example VDD, if a logical 1 corresponds to VDD and a logical zero corresponds to ground) is above the threshold value and outputs a Good_Zero of 1 signal which indicates that a stable zero state is present. By comparison, the comparator 64 outputs a value of 0 as Good_One signal since the inputs are exchanged here and thus, for example, the –VDD value is below the threshold value. Due to the OR linkage of the OR gate 65, a signal value 1 is then output at output 66 which indicates a stable state (ok).

If a value of 1 is stored, the conditions are reversed. In this case, for example, a logical 0 is present at input 60 (corresponding to, for example, ground) and a logical 1 (corresponding to VDD) at the second input 61. In this case, the comparator 63 outputs a 0 as Good_Zero and comparator 64 outputs a 1 as Good_One which indicates that a stable state 1 is stored. This, in turn, leads to the output of a signal 1 having the value 1 at output 66.

In the case of a metastable state, in contrast, the voltage values are at least approximately equal at inputs 60, 61 and thus the differences formed by comparators 63, 64 are close to zero and do no exceed the predetermined threshold value. In this case, a 0 is output by both comparators 63, 64 and the output signal at output 66 is also 0 so that a metastable state is indicated.

It must be noted that in other exemplary embodiments, instead of the ok signal at output 66, the output signals Good_Zero and Good_One of comparators 63, 64 can also be output separately, for example to a subsequent device (such as the further device 11 of FIG. 1) and the evaluation can then take place in the further device.

Figure 7:
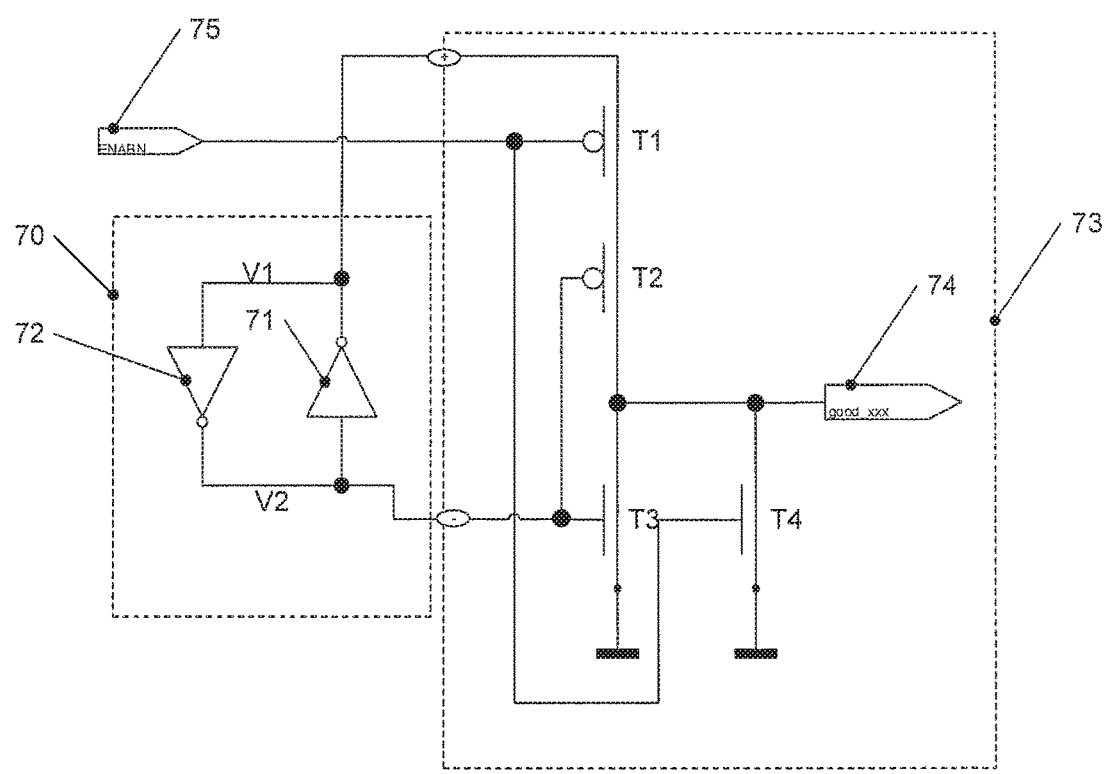
FIG. 7 shows an exemplary embodiment of a part of the metastability detector of FIG. 6.

FIG. 7 shows a possible embodiment of one of the comparators 63, 64 of FIG. 6, a simple implementation having only four transistors being used here. In FIG. 7, 70 generally designates a part of a latch, particularly negative feedback inverters 71, 72. The latch can also have other components, for example as shown in FIGS. 4 and 5. 73 designates an implementation of a comparator which can be used, for example, for implementing comparator 63 or comparator 64 of FIG. 6. An output of the comparator is designated by 74 and correspondingly outputs the Good_Zero or Good_One signal, generically designated here by Good_XXX. To implement the other comparator in each case, the terminals of comparator 73 to the pair of negative feedback inverters 71, 72 are only exchanged, in accordance with the "exchanged" inputs between comparators 63 and 64 of FIG. 6.

75 designates an activation input to which an activation signal, for example the activation signal of the third terminal 62 of FIG. 6, is to be supplied.

Comparator 73 comprises four transistors T1 to T4, transistors T1 and T2 being implemented as PMOS transistors and transistors T3 and T4 being implemented as NMOS transistors in the example of FIG. 7. The inputs of comparator 73 are identified by "+" and "−" in FIG. 7 in accordance with the usual designation of the comparator inputs as is also used in FIG. 6.

In this context, transistors T1 to T4 are interconnected as shown in FIG. 7. In particular, gate terminals of transistors T2 and T3 (which form the "−" input) are connected to a node, designated by V2, of the pair of negative feedback inverters 71, 72. Gate terminals of transistors T1 and T4 are connected to the activation terminal 72. Transistors T1, T2 are furthermore connected with their load sections (i.e. between source and drain), corresponding to the "+" input, in series between a node V1 of the pair of negative feedback inverters 71, 72 and the output 74. Transistors T3, T4 are interconnected with their load sections between output 74 and ground as reference potential.

The operation of comparator 73 for three different states of the latch will now be explained in greater detail with reference to FIGS. 8A to 8C.

If the activation signal at terminal 75 is equal to 1, transistor T1 is cut off and transistor T4 is conducting and thus draws terminal 74 to ground corresponding to a logical 0. This corresponds to an inactive state of the comparator. Thus, if the activation signal is 1 (which corresponds to the transparent state of the latch as explained with reference to FIG. 5), a 0 will always be output independently of the state of latch 70.

Figures 8A, 8B, 8C:
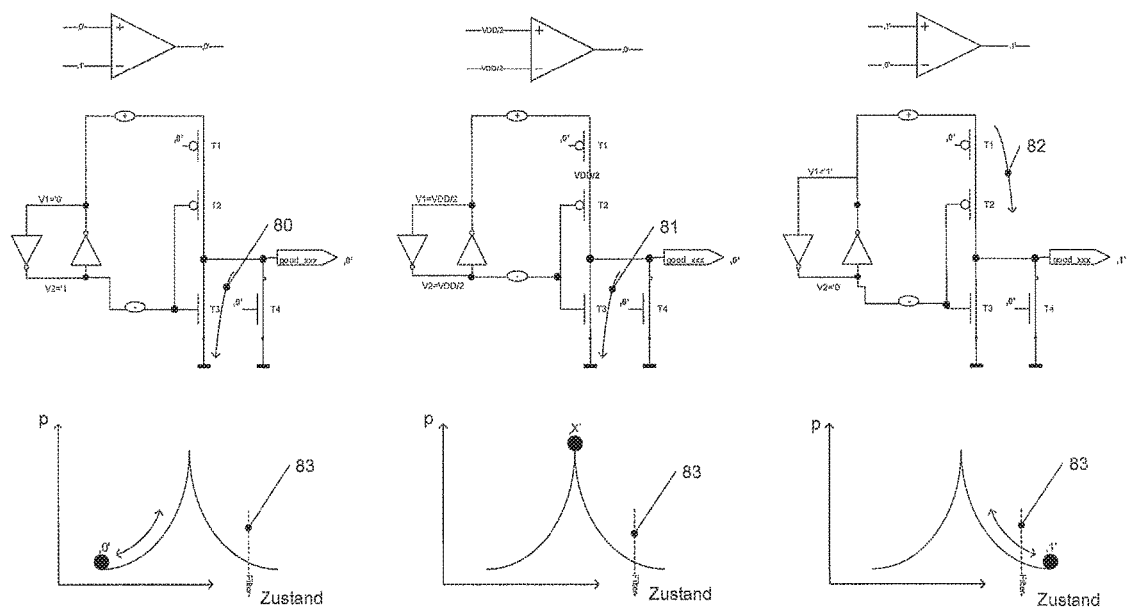
FIGS. 8A to 8C show examples of the operation of the metastability detector of FIG. 7.

In FIGS. 8A to 8C, three different states of the latch are now shown (stable state 0 in FIG. 8A, stable state 1 in FIG. 8C and metastable state in FIG. 8B), the activation signal being 0. This corresponds to an active state of the comparator and to a memory state of the latch. In FIGS. 8A to 8C, the circuit of FIG. 7 is shown again with the comparator in each case in an upper part, and in a lower part, a diagram as already used in FIGS. 3A to 3C is shown. Above the circuit of FIG. 7, a comparator symbol with the signals correspondingly present at the terminals is shown in each case.

For the purpose of explanation of FIGS. 8A to 8C, a state in which V1 is at a logical 0 and V2 at a logical 1, is designated as state 0 of the latch and a state in which V1 is at 1 and V2 at 0 is designated as state 1.

In FIGS. 8A to 8C, it is assumed, as mentioned above, that the activation signal is 0. Transistor T1 is thus conducting and transistor T4 is cut off. Thus, transistors T1 and T4 no longer need to be considered in the subsequent implementations.

In state 0 (FIG. 8A) a value 1 is applied to the gate terminals of transistors T2 and T2. Transistor T2 is thus cut off and transistor T3 is conducting and draws the output to 0 as is indicated by an arrow 80. Thus, a 0 is output in this case.

In the metastable state of FIG. 8B, the voltages are equal at V1 and V2, for example in each case about VDD/2. Since transistor T1 is conducting, this leads to approximately the same voltage being present at the gate terminal and at the source terminal of transistor T2 and transistor T2 being cut off because of that. In particular, the voltage difference between source and gate is at least small enough so that an activation voltage of transistor T2 is not exceeded.

In contrast, transistor T3 is at least weakly conducting due to the voltage at its gate terminal (even if not in saturation as a rule), which is sufficient to draw the output to 0 as indicated by an arrow 81.

In the case of FIG. 8C, V1 is now at a logical 1 and V2 at a logical 0. As a result, transistor T3 is cut off and transistor T2 becomes conducting so that the output, as indicated by an arrow 82, is referred to the voltage V1 corresponding to a logical 1.

The point of switching between the state in which a 0 is output and the state in which a 1 is output depends on the threshold voltages of the transistors used and is designated by a line 83 in FIGS. 8A to 8C below. Thus, there is here a filter function, so to speak, at which the output is switched to 1 only when the signal level V1 exceeds the signal level V2 by a predetermined threshold value which depends on the transistor thresholds. Such a filter function is also called Seitz filter.

Thus, the output signal of the comparator circuit is only activated by a certain stable state (in the case of FIGS. 8A to 8C, V1 equal to 1 and V2 equal to 0). As explained with reference to FIG. 6, a further comparator circuit can be provided which is constructed like the comparator circuit of FIGS. 7 and 8 and at which only the terminals to the latch are exchanged. This then switches to 1 at the respective other stable state. In this way, the presence of a stable state can be detected reliably.

Figure 9:
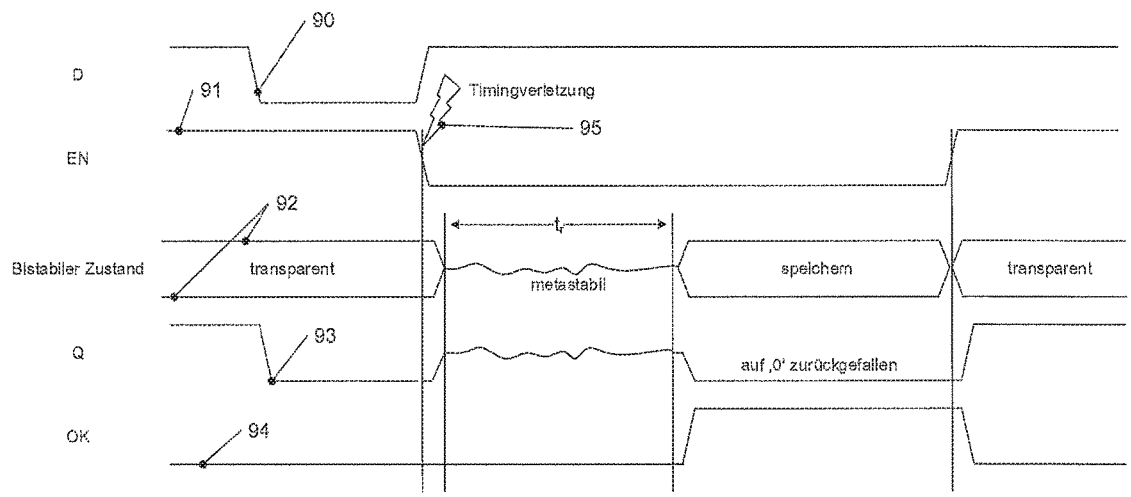
FIG. 9 shows exemplary signals for illustrating the operation of some exemplary embodiments.

For further illustration, FIG. 9 shows exemplary signals as may occur, for example, in the circuit of FIG. 5. The signals of FIG. 9 are then only used as example and there can also be other signals present depending on implementation and activation.

A curve 90 shows an example of a data signal which, for example, is present at input 42 of FIG. 5. A curve 91 shows an activation signal as is present, for example, at terminal 43 of FIG. 5. Curves 92 indicate an internal state of the latch. A curve 93 shows an example of an output signal Q as is present, for example, at output 47 of FIG. 5, and a curve 94 shows an ok signal as is present, for example, at output 51 of FIG. 5.

At the beginning, the activation signal 91 is at 1 and the latch is transparent as indicated by curves 92. Output 93 therefore follows the data signal 90. In addition, the ok signal 94 is at 0 since the activation signal 91 is at 1.

At a certain time, the activation signal is switched to 0 in order to perform a memory. Since in the example of FIG. 9, the data signal 90 switches virtually simultaneously with switching of the activation signal 91 to 0, a timing violation occurs (for example a hold violation if the value 0 of the data signal 90, which is present before switching of the signal 91, is to be stored). This leads to a metastable state of the latch which leads to an output signal 93 which is between a logical 1 and a logical 0 and can fluctuate due to noise. During this time of the metastable state, the ok signal 94 remains at 0. After the recovery time $t_R$, the metastable state ends and the latch drops to a value of 0 in the example which is then output as the signal 93. Since a stable state is then present, the ok signal 94 goes to 1. At a later time in FIG. 9, the activation signal 91 is then switched again to 1 which switches the latch to be transparent and has the effect that the ok signal goes back to 0 and the output signal 93 follows the data signal 90.

As illustrated by FIG. 9, it is thus possible, due to the ok signal, for other devices, for example downstream circuits, to detect whether there is a stable state in the latch.

As already explained, a latch is only used for explanation here and the present techniques and methods can be applied to other memory devices, for example memory devices which comprise a number of latches (for example flip-flops constructed from latches) or other memory devices, particularly static memory devices which comprise negative feedback inverters.

Figure 10:
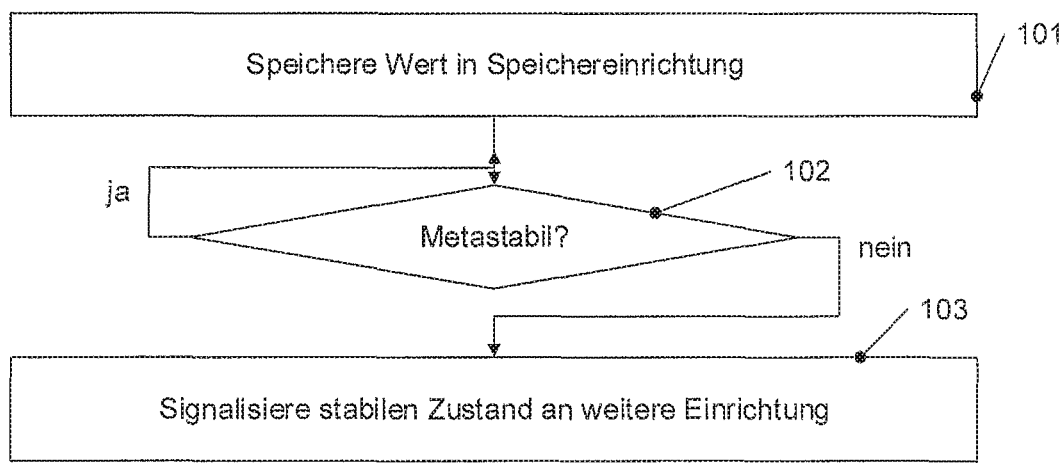
FIG. 10 shows a flowchart for illustrating a method according to an exemplary embodiment.

In FIG. 10, a method according to an exemplary embodiment is shown. The method of FIG. 10 can be executed, in particular, by means of the devices and systems discussed above, and modifications and variants which have been discussed for the systems and memory devices are also applicable to the method of FIG. 10.

At 101, a value is stored in a memory device. This can be effected, for example, by corresponding controlling of an activation signal. In addition, a signalling signal can be set to a default value, particularly a value which specifies that there is no stable state or a metastable state, respectively.

At 102, it is checked whether a state in the memory device is metastable. This test persists for as long as the metastability lasts. In addition, it can be signalled at 102 with the signalling signal that a metastable state or at least no stable state is present.

If then no further metastable state is present, it is signalled at 103 with the signalling signal that a stable state is now present.

The exemplary embodiments discussed above are only used for illustration and should not be interpreted as being restrictive.

What is claimed is:

1. A memory device comprising:
    a data input node configured to receive input data to be written into the memory device,
    a data output node configured to output stored data read from the memory device,
    a metastability detector configured to detect a stable state in the memory device,
    a further output node coupled to the metastability detector, wherein the metastability detector is configured to output a signal via the further output node to indicate that the stable state is detected by the metastability detector, and
    an activation terminal configured to receive an activation signal for switching the memory device between a transparent state and a memory state, the metastability detector being configured to output a value which does not specify the stable state when the memory device is in the transparent state.

2. The memory device according to claim 1, the memory device comprising a pair of inverters comprising a first inverter and a second inverter coupled in a negative feedback configuration, wherein an input of the first inverter is coupled to an output of the second inverter at a first node, wherein an input of the second inverter is coupled to an output of the first inverter at a second node, and wherein the metastability detector is configured to detect when the stable state is present by evaluating voltages at the first node and the second node of the pair of inverters.

3. The memory device according to claim 1, wherein the metastability detector comprises:
    a first comparator configured to calculate a first value by subtracting a signal level at a second node from a signal level at a first node and compare the first value with a first threshold value, and
    a second comparator configured to calculate a second value by subtracting the signal level at the first node from the signal level at the second node and compare the second value with a second threshold value.

4. The memory device according to claim 3, at least one of the first comparator or the second comparator comprising a first transistor and a second transistor, a control terminal of the first transistor and a control terminal of the second transistor being coupled to one of the first node or the second node, a first load terminal of the first transistor being coupled to the other one of the first node or the second node, a second load terminal of the first transistor being coupled to a first load terminal of the second transistor and to an output, a second load terminal of the second transistor being coupled to a reference potential.

5. The memory device according to claim 4, at least one of the first comparator or the second comparator additionally comprising a third transistor and a fourth transistor, a control terminal of the third transistor and a control terminal of the fourth transistor being coupled to the activation terminal, a first load terminal of the third transistor being coupled to the other one of the first node or the second node, a second load terminal of the third transistor being coupled to the first load terminal of the first transistor, a first load terminal of the fourth transistor being coupled to the output and a second load terminal of the fourth transistor being coupled to the reference potential.

6. The memory device according to claim 2, wherein the first node is the same as the data input node, and wherein the second node is the same as the data output node.

7. A system comprising:
    a memory device, comprising:
        a data input node configured to receive input data to be written into the memory device,
        a data output node configured to output stored data read from the memory device,
        a metastability detector configured to detect a stable state in the memory device, and
        a further output node coupled to the metastability detector, wherein the metastability detector is configured to output a signal via the further output node to indicate that the stable state is detected by the metastability detector; and
    a further device coupled to the data output node, the further device configured to process the stored data read from the memory device, and wherein the further device is coupled to the further output node and is configured to process the stored data only if the signal at the further output node indicates that the stable state is present.

8. The system according to claim 7, the further device coupled to the further output node and being configured to trigger a safety measure if the signal at the further output node indicates that the stable state is not present.

9. The system according to claim 7, the further device being configured to set up a synchronization based on the signal at the further output node.

10. The system according to claim 7, wherein the memory device further comprises:
    a pair of inverters comprising a first inverter and a second inverter coupled in a negative feedback configuration, wherein an input of the first inverter is coupled to an output of the second inverter at a first node, wherein an input of the second inverter is coupled to an output of the first inverter at a second node, and wherein the metastability detector is configured to detect when the stable state is present by evaluating voltages at the first node and the second node of the pair of inverters.

11. The system according to claim 7, wherein the memory device further comprises:

an activation terminal configured to receive an activation signal for switching the memory device between a transparent state and a memory state, the metastability detector being configured to output a value which does not specify the stable state when the memory device is in the transparent state.

12. The system according to claim 7, wherein the metastability detector comprises:
   a first comparator configured to calculate a first value by subtracting a signal level at a second node from a signal level at a first node and compare the first value with a first threshold value, and
   a second comparator configured to calculate a second value by subtracting the signal level at the first node from the signal level at the second node and compare the second value with a second threshold value.

13. The system according to claim 12, at least one of the first comparator or the second comparator comprising a first transistor and a second transistor, a control terminal of the first transistor and a control terminal of the second transistor being coupled to one of the first node or the second node, a first load terminal of the first transistor being coupled to the other one of the first node or the second node, a second load terminal of the first transistor being coupled to a first load terminal of the second transistor and to an output, a second load terminal of the second transistor being coupled to a reference potential.

14. The system according to claim 13, the memory device additionally comprising an activation terminal configured to receive an activation signal for switching the memory device between a transparent state and a memory state, at least one of the first comparator or the second comparator additionally comprising a third transistor and a fourth transistor, a control terminal of the third transistor and a control terminal of the fourth transistor being coupled to the activation terminal, a first load terminal of the third transistor being coupled to the other one of the first node or the second node, a second load terminal of the third transistor being coupled to the first load terminal of the first transistor, a first load terminal of the fourth transistor being coupled to the output and a second load terminal of the fourth transistor being coupled to the reference potential.

15. A memory device comprising:
   a pair of inverters coupled in a negative feedback configuration comprising a first inverter and a second inverter, wherein an input of the first inverter is coupled to an output of the second inverter at a first node, wherein an input of the second inverter is coupled to an output of the first inverter at a second node, and
   a metastability detector, the metastability detector comprising:
      a first comparator configured to calculate a first value by subtracting a signal level at the second node from a signal level at the first node and compare the first value with a first threshold value and
      a second comparator configured to calculate a second value by subtracting the signal level at the first node from the signal level at the second node and compare the second value with a further threshold value.

16. The memory device according to claim 15, at least one of the first comparator or the second comparator comprising a first transistor and a second transistor, a control terminal of the first transistor and a control terminal of the second transistor being coupled to one of the first node and the second node, a first load terminal of the first transistor being coupled to the other one of the first node and of the second node, a second node terminal of the first transistor being coupled to a first load terminal of the second transistor and to an output, a second load terminal of the second transistor being coupled to a reference potential.

17. The memory device according to claim 16, the memory device additionally comprising an activation terminal configured to receive an activation signal for switching the memory device between a transparent state and a memory state, at least one of the first comparator or the second comparator additionally comprising a third transistor and a fourth transistor, a control terminal of the third transistor and a control terminal of the fourth transistor being coupled to the activation terminal, a first load terminal of the third transistor being coupled to the other one of the first node or of the second node, a second load terminal of the third transistor being coupled to the first load terminal of the first transistor, a first load terminal of the fourth transistor being coupled to the output and a second load terminal of the fourth transistor being coupled to the reference potential.

18. The memory device according to claim 15, the memory device being a latch.

* * * * *